United States Patent
Chen et al.

(10) Patent No.: US 10,622,461 B1
(45) Date of Patent: Apr. 14, 2020

(54) MANUFACTURING METHOD OF SEMICONDUCTOR DEVICE HAVING REPLACEMENT GATE IN TRENCH

(71) Applicant: UNITED MICROELECTRONICS CORP., Hsin-Chu (TW)

(72) Inventors: Pai-Chi Chen, Pingtung County (TW); Chian-Ting Huang, Tainan (TW); Yung-Feng Cheng, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/247,587

(22) Filed: Jan. 15, 2019

(51) Int. Cl.
| H01L 29/66 | (2006.01) |
| H01L 21/28 | (2006.01) |
| H01L 21/8234 | (2006.01) |
| H01L 29/78 | (2006.01) |
| H01L 29/423 | (2006.01) |
| H01L 29/40 | (2006.01) |
| H01L 29/739 | (2006.01) |

(52) U.S. Cl.
CPC .. *H01L 29/66734* (2013.01); *H01L 21/28017* (2013.01); *H01L 21/823437* (2013.01); *H01L 21/823487* (2013.01); *H01L 29/407* (2013.01); *H01L 29/4236* (2013.01); *H01L 29/42352* (2013.01); *H01L 29/42364* (2013.01); *H01L 29/7397* (2013.01); *H01L 29/7813* (2013.01); *H01L 29/7825* (2013.01)

(58) Field of Classification Search
CPC ..... H01L 21/823437; H01L 21/823487; H01L 29/4236; H01L 29/42364; H01L 29/66734; H01L 29/7813; H01L 29/407; H01L 29/42352; H01L 29/7397; H01L 29/7825; H01L 21/28017
See application file for complete search history.

(56) References Cited

U.S. PATENT DOCUMENTS

| 8,835,312 | B2 | 9/2014 | Kim | |
| 2012/0256273 | A1 | 10/2012 | Chiang | |
| 2016/0372470 | A1* | 12/2016 | Ok | H01L 21/823828 |
| 2017/0194210 | A1 | 7/2017 | Oh | |
| 2017/0194443 | A1* | 7/2017 | Chen | H01L 21/30604 |
| 2017/0352668 | A1* | 12/2017 | Li | H01L 21/823821 |

\* cited by examiner

*Primary Examiner* — Michael Jung
(74) *Attorney, Agent, or Firm* — Winston Hsu

(57) ABSTRACT

A manufacturing method of a semiconductor device includes the following steps. Trenches are formed on a substrate, and the trenches are formed on a first region and a second region defined on the substrate. A barrier layer is formed conformally in the trenches. A first pull-down process is performed to the barrier layer on the second region. The barrier layer on the first region is covered by a first mask during the first pull-down process. A second pull-down process is performed to the barrier layer on the first region. The barrier layer on the second region is covered by a second mask during the second pull-down process. A proportion of an area of the trenches on the first region to an area of the first region is different from a proportion of an area of the trenches on the second region to an area of the second region.

19 Claims, 18 Drawing Sheets

MANUFACTURING METHOD OF SEMICONDUCTOR DEVICE HAVING REPLACEMENT GATE IN TRENCH

BACKGROUND OF THE INVENTION

1. Field of the Invention

The present invention relates to a manufacturing method of a semiconductor device, and more particularly, to a manufacturing method of a semiconductor device including gate trenches.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly.

Poly-silicon is conventionally used as a gate electrode in semiconductor devices, such as the metal-oxide-semiconductor (MOS). With the trend towards scaling down the size of semiconductor devices, however, conventional poly-silicon gates face problems such as inferior performance due to boron penetration and unavoidable depletion effects. This increases equivalent thickness of the gate dielectric layer, reduces gate capacitance and worsens a driving force of the devices. Therefore, work function metals that are suitable for use as the high-k gate dielectric layer are used to replace the conventional poly-silicon gate to be the control electrode. Generally, metal gate stack structures including the work function metal and the high-k gate dielectric layer are formed by a replacement metal gate (RMG) process. As the critical dimension of the metal gate stack structure becomes smaller, many manufacturing problems of the RMG process become more serious and have to be solved for improving the manufacturing yield.

SUMMARY OF THE INVENTION

A manufacturing method of a semiconductor device is provided by the present invention. In the manufacturing method, different pull-down processes are performed to a barrier layer in trenches on regions with different trench densities respectively for reducing a height variation range of the barrier layer in different trenches and improving the related electrical properties of the semiconductor device.

According to an embodiment of the present invention, a manufacturing method of a semiconductor device is provided. The manufacturing method includes the following steps. Trenches are formed on a substrate. A first region and a second region are defined on the substrate, and the trenches are formed on the first region and the second region. A barrier layer is formed conformally in the trenches. A first pull-down process is performed to the barrier layer in the trenches formed on the second region. The barrier layer in the trenches formed on the first region is covered by a first mask during the first pull-down process. A second pull-down process is performed to the barrier layer in the trenches formed on the first region. The barrier layer in the trenches formed on the second region is covered by a second mask during the second pull-down process. A proportion of an area of the trenches on the first region to an area of the first region is different from a proportion of an area of the trenches on the second region to an area of the second region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic drawings illustrating a manufacturing method of a semiconductor device according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

FIGS. 10-13 are schematic drawings illustrating the method for forming the first mask and the second mask according to the first embodiment of the present invention, wherein FIG. 11 is a schematic drawing in a step subsequent to FIG. 10, FIG. 12 is a schematic drawing in a step subsequent to FIG. 11, and FIG. 13 is a schematic drawing in a step subsequent to FIG. 12.

FIGS. 15-18 are schematic drawings illustrating the method for forming the first mask and the second mask according to the second embodiment of the present invention, wherein FIG. 16 is a schematic drawing in a step subsequent to FIG. 15, FIG. 17 is a schematic drawing in a step subsequent to FIG. 16, and FIG. 18 is a schematic drawing in a step subsequent to FIG. 17.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
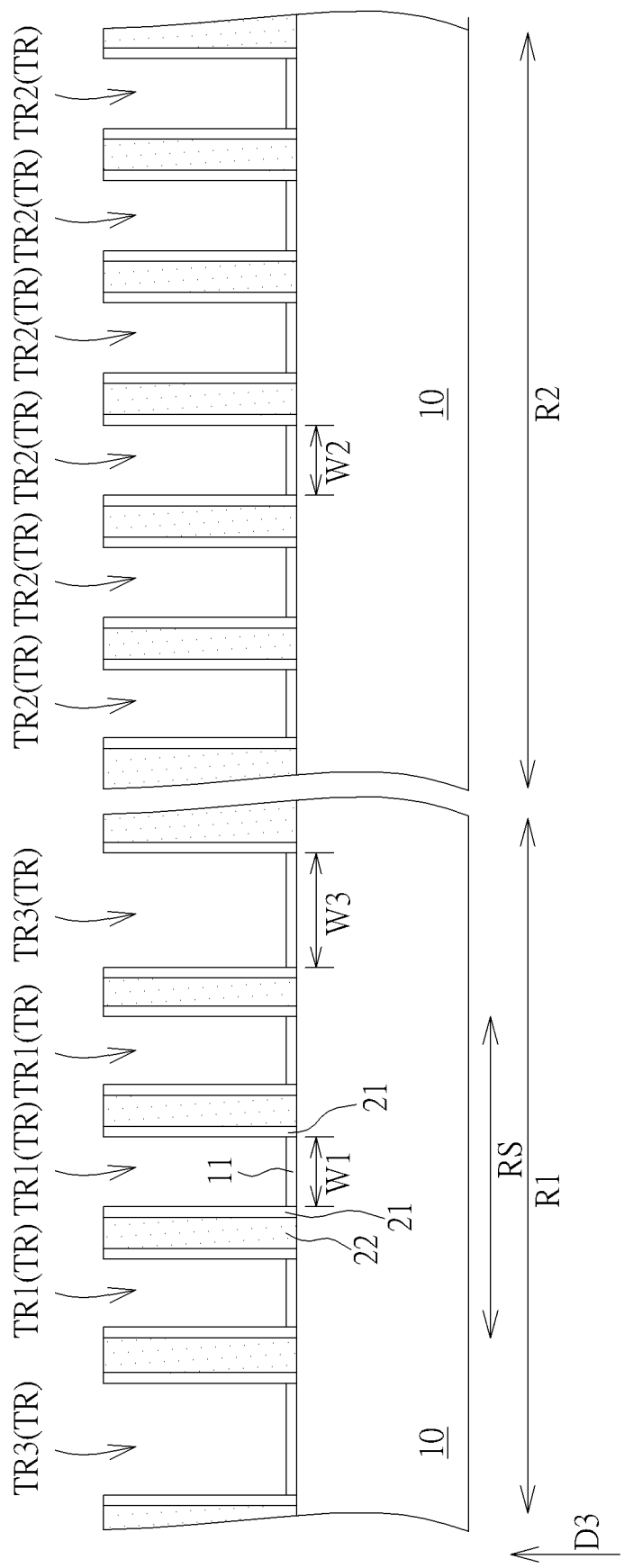

Please refer to FIGS. 1-8. FIGS. 1-8 are schematic drawings illustrating a manufacturing method of a semiconductor device according to an embodiment of the present invention. The manufacturing method of the semiconductor device in this embodiment includes the following steps. As shown in FIG. 1, a substrate 10 is provided, and a plurality of trenches TR may be formed on the substrate 10. A first region R1 and a second region R2 are defined on the substrate 10, and the trenches TR are formed on the first region R1 and the second region R2. Specifically, some of the trenches TR may be formed on the first region R1, and some of the trenches may be formed on the second region R2. In some embodiments, each of the trenches TR may be a gate trench, and gate structures (not shown in FIG. 1) may be formed in the trenches TR respectively. In some embodiments, the substrate 10 may include a semiconductor substrate such as a silicon substrate, an epitaxial silicon substrate, a silicon germanium substrate, a silicon carbide substrate, or a silicon-on-insulator (SOI) substrate, but not limited thereto. In some embodiments, the substrate 10 may include a plurality of fin-shaped semiconductor structures (not shown), and the trenches TR may be formed straddling the fin-shaped semiconductor structures.

In some embodiments, the trenches TR and the gate structures mentioned above may be formed by a replacement metal gate (RMG) process, but not limited thereto. For example, a plurality of interfacial layer 11 and a plurality of dummy gates (not shown) may be formed on the substrate 10, and spacers 21 may then be formed on sidewalls of the dummy gates. A plurality of source/drain structures (not shown) may be formed in the substrate 10 by using the spacer 21 as a mask. A dielectric layer 22 may then be formed covering the dummy gates and the source/drain structures. A planarization process, such as a chemical mechanical polishing (CMP) process, may be performed to remove the dielectric layer 22 above the dummy gates in a third direction D3 perpendicular to the substrate 10 for exposing the dummy gates, and the dummy gates may be removed to form the trenches TR. The third direction D3 may be regarded as a thickness direction of the substrate 10, but not limited thereto. In some embodiments, the interfacial layer 11 may include an oxide dielectric layer, such as a silicon oxide layer. The spacer 21 may include silicon nitride ($SiN_x$), silicon carbon nitride (SiCN), silicon-carbon-oxy-nitride (SiCON), or other suitable insulation materials. The dielectric layer 22 may include silicon nitride, silicon oxide, or other suitable insulation materials.

The gate structures formed in the trenches TR by the subsequent processes may be used as gate electrodes for different semiconductor units, such as different transistors, and the dimensions of some of the trenches TR may be different from each other for the design requirements. For example, the trenches TR on the first region R1 may include plurality of first trenches TR1 and a plurality of third trenches TR3, and the trenches TR on the second region R2 may include a plurality of second trenches TR2. The first trenches TR1 may be formed on a sub region RS within the first region R1, and the third trenches TR3 may be formed outside the sub region RS. A width of each of the first trenches TR1 (such as a first width W1 shown in FIG. 1) may be substantially equal to a width of each of the second trenches TR2 (such as a second width W2 shown in FIG. 1), and a width of each of the third trenches TR3 (such as a third width W3 shown in FIG. 1) may be different from the first width W1. Therefore, a proportion of an area of the trenches TR on the first region R1 to an area of the first region R1 may be different from a proportion of an area of the trenches TR on the second region R2 to an area of the second region R2. The area of each trench TR may be a projection area of the trench TR in the third direction D3, but not limited thereto. The proportion of the area of the trenches TR on the first region R1 to the area of the first region R1 may be regarded as a trench density on the first region R1, and the proportion of the area of the trenches TR on the second region R2 to the area of the second region R2 may be regarded as a trench density on the second region R2. The trench density on the first region R1 may be different from the trench density on the second region R2. For example, the third width W3 of each of the third trenches TR3 may be larger than the first width W1 of each of the first trenches TR1, and the trench density on the first region R1 may be higher than the trench density on the second region R2. In some embodiments, the trench density on a specific region may be proportioned to a density of the dummy gates described above on the region, but not limited thereto.

Figure 2:
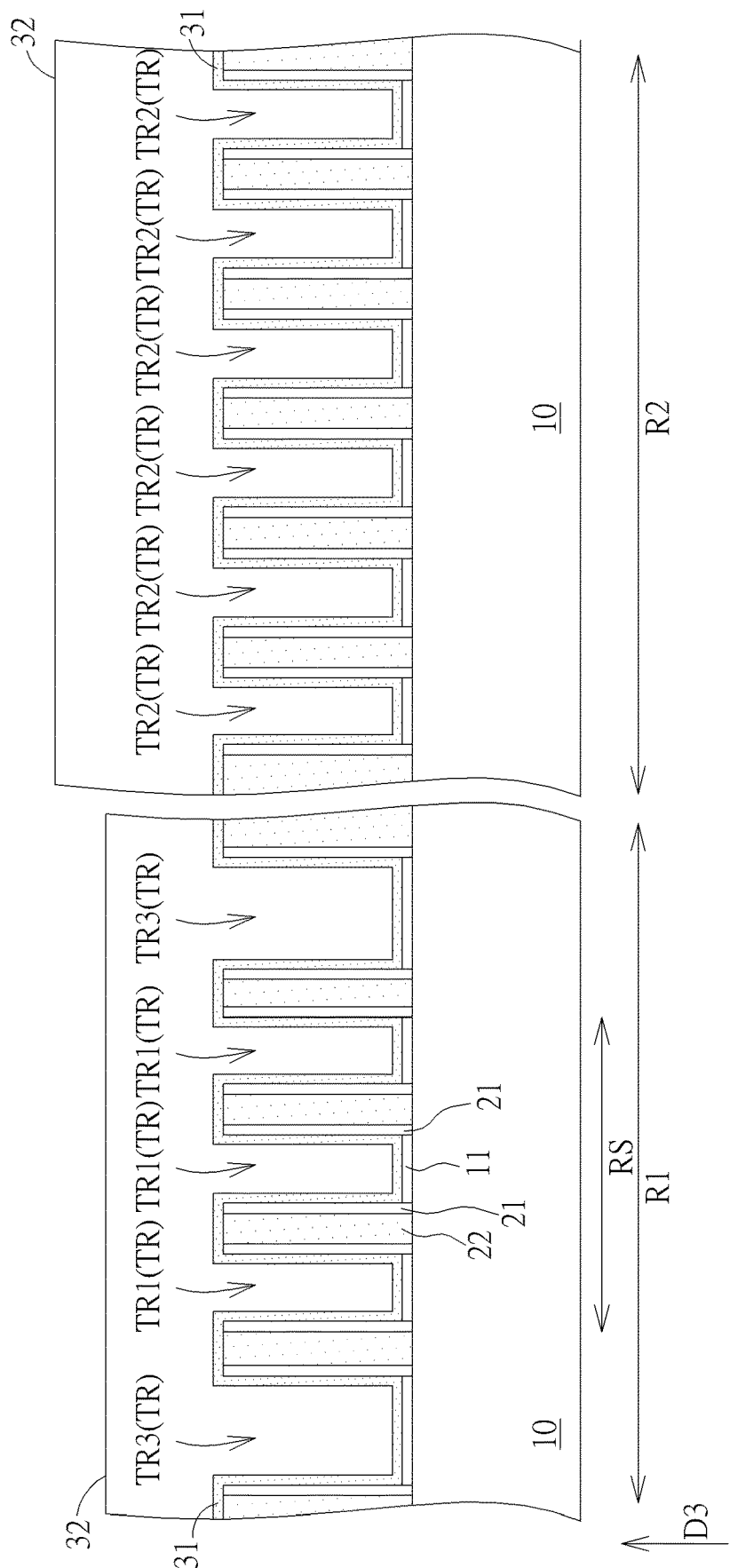

As shown in FIG. 2, a barrier layer 31 is formed conformally in the trenches TR and formed conformally on the dielectric layer 22 and the spacers 21. The barrier layer 31 may include conductive barrier materials, such as titanium nitride (TiN), tantalum nitride (TaN), or other suitable barrier materials. After the step of forming the barrier layer 31, a dielectric layer 32 may be formed on the barrier layer 31, and the trenches TR may be fully filled with the barrier layer 31 and the dielectric layer 32. In some embodiments, the dielectric layer 32 may include a bottom anti-reflection coating (BARC) layer or other suitable dielectric materials. The density of the dielectric layer 32 in the trenches TR above the first region R1 may be different from the density of the dielectric layer 32 in the trenches TR above the second region R2 because the proportion of the area of the trenches TR above the first region R1 to the area of the first region R1 is different from the proportion of the area of the trenches TR above the second region R2 to the area of the second region R2, and the barrier layer 31 is formed conformally in the trenches above the first region R1 and the second region R2. The density of the dielectric layer 32 will influence the performance of a pull-down process subsequently performed to the barrier layer 31, and the different pull-down processes may be performed to the first region R1 and the second region R2 respectively for reducing the height difference between the barrier layer 31 in the first trench TR1 and the barrier layer 31 in the second trench TR2 after the pull-down processes.

Figure 3:
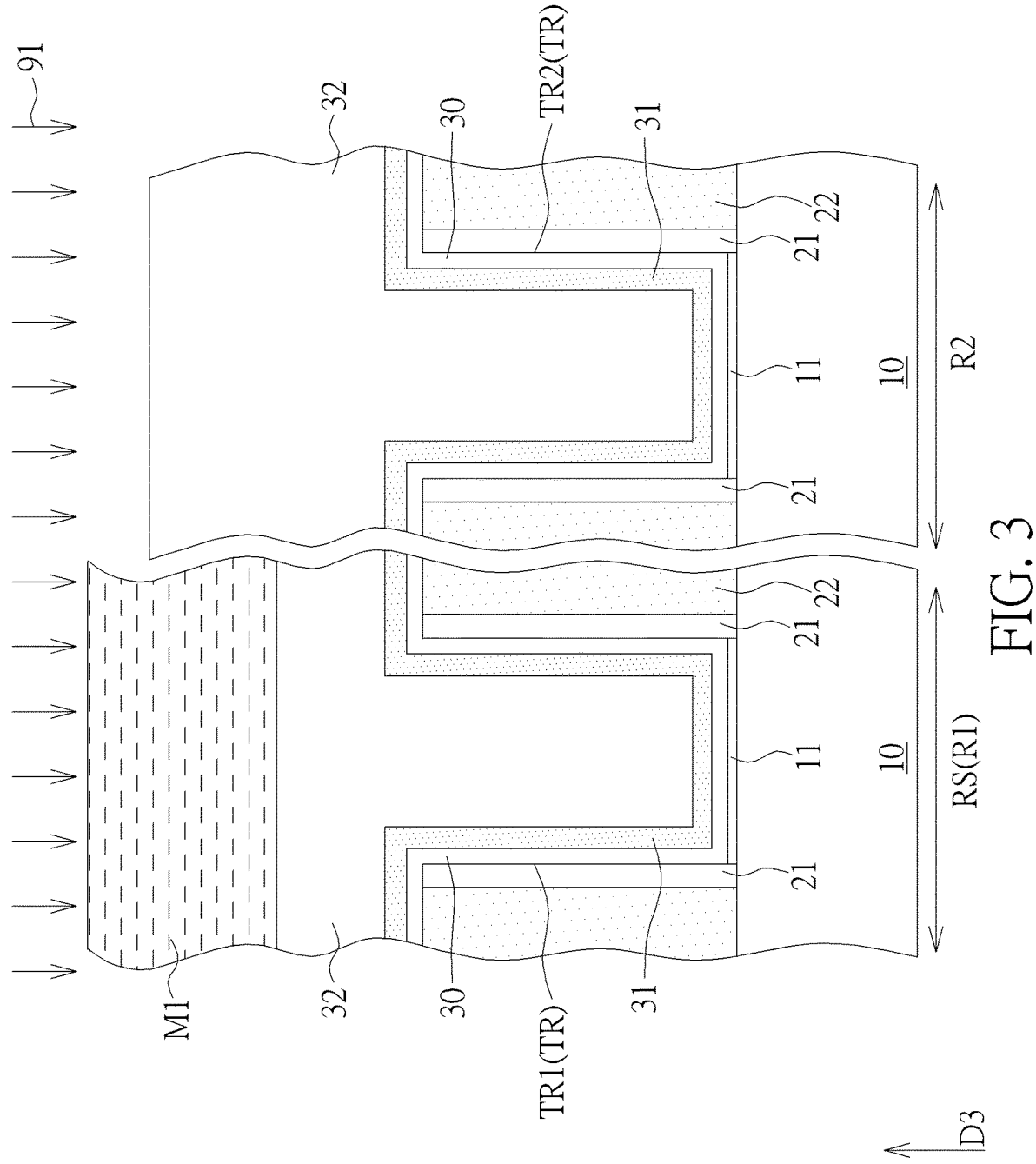
Figure 4:
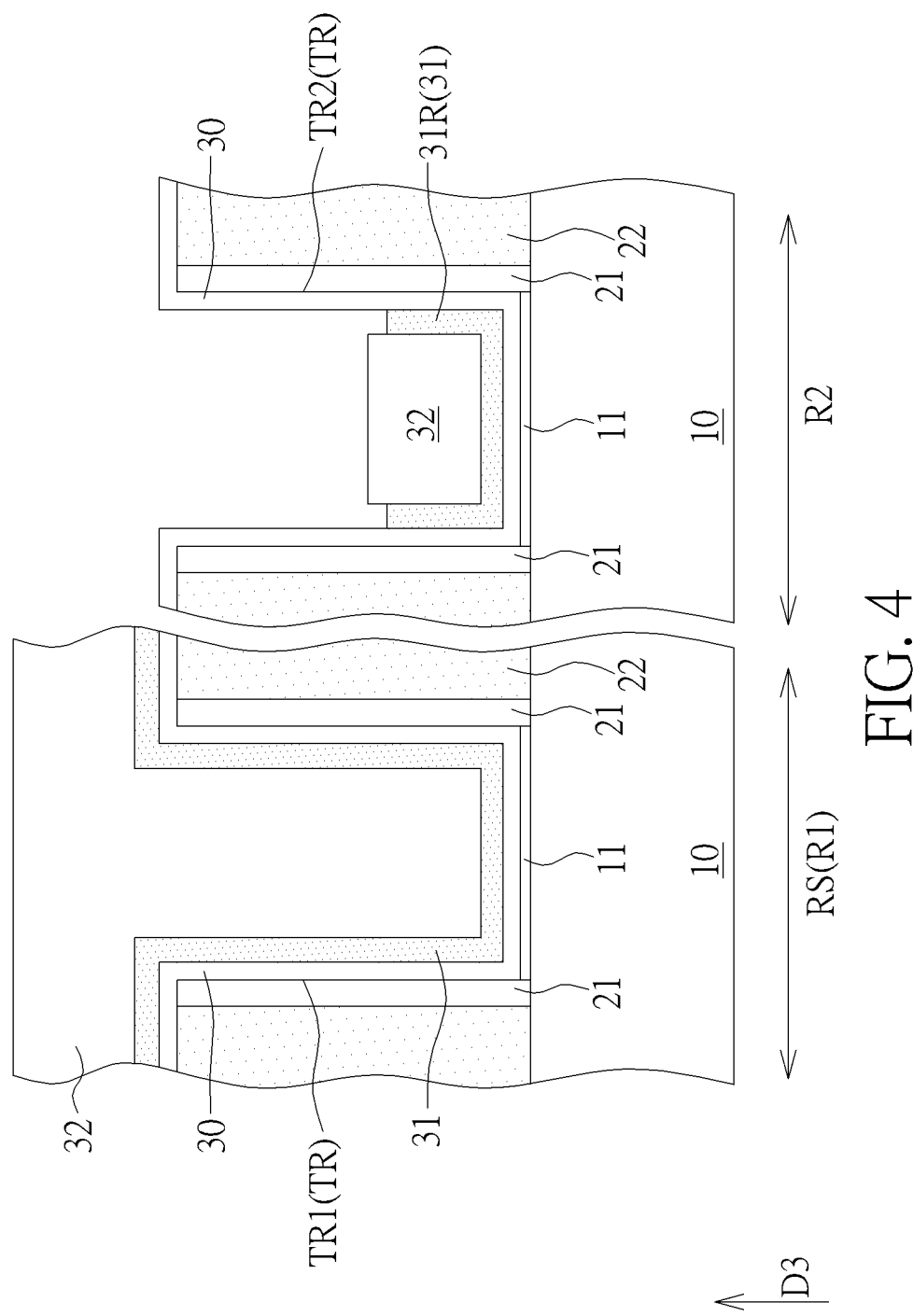
Figure 5:
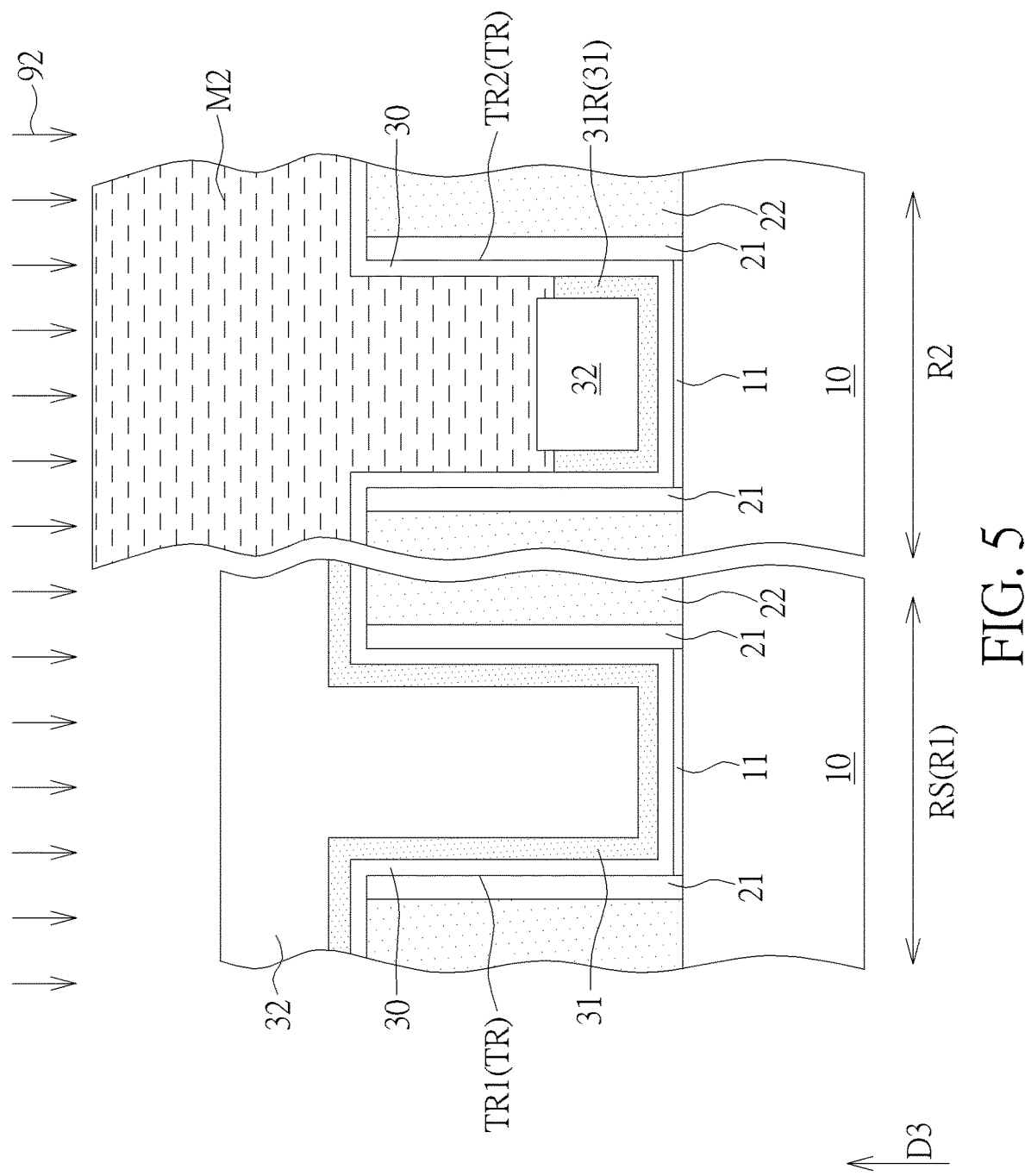
Figure 6:
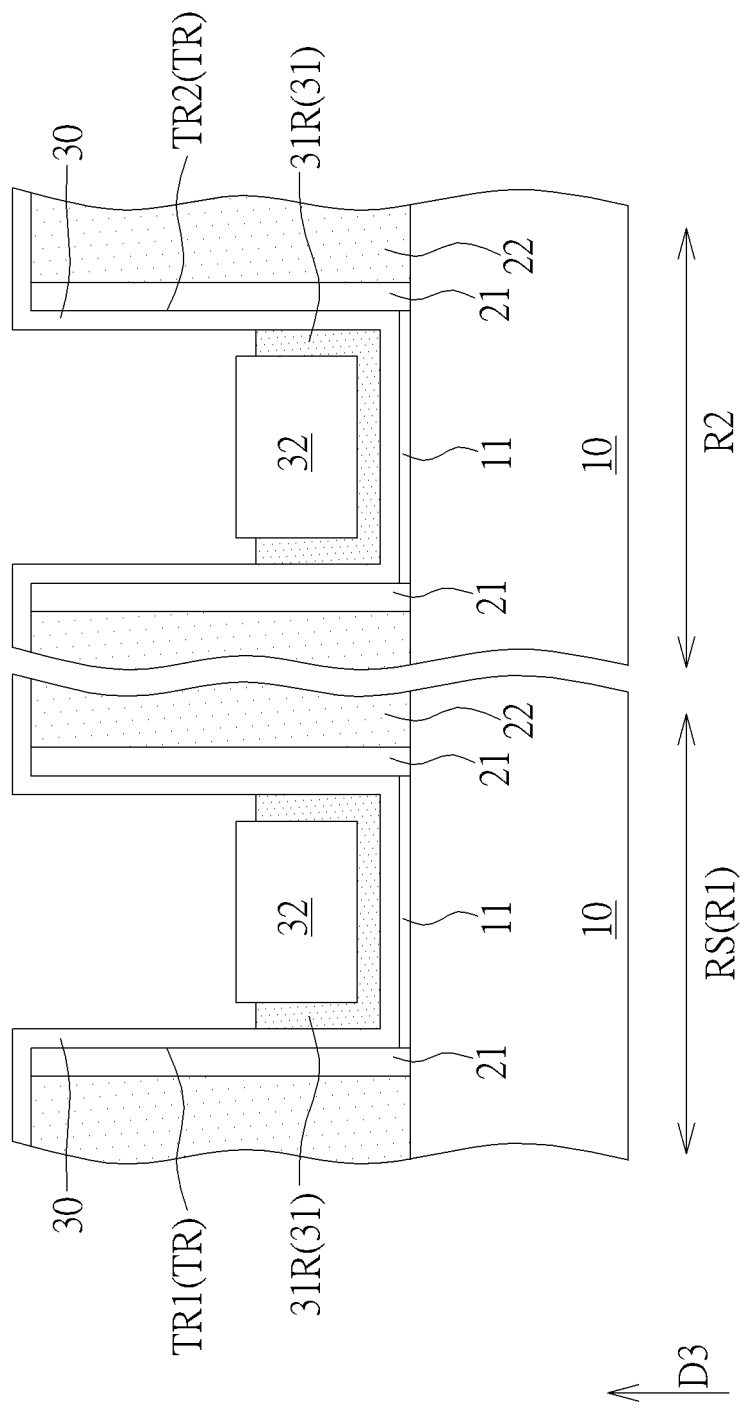

As shown in FIG. 3, a first pull-down process 91 may be performed to the barrier layer 31 in the trenches TR formed on the second region R2, and the barrier layer 31 in the trenches TR formed on the first region R1 may be covered by a first mask M1 during the first pull-down process 91. As shown in FIG. 5, a second pull-down process 92 may be performed to the barrier layer 31 in the trenches TR formed on the first region R1, and the barrier layer 31 in the trenches TR formed on the second region R2 may be covered by a second mask M2 during the second pull-down process 92. The first pull-down process 91 and the second pull-down process 92 may be etching back processes for removing a part of the barrier layer 31 and a part of the dielectric layer 32. The etching back process described above may be an anisotropic etching process, such as a dry etching process, or other suitable etching approaches. As shown in FIG. 3 and FIG. 4, the first mask M1 is removed after the first pull-down process 91, and the topmost surface of the barrier layer 31 in the second trench TR2 is lower than the topmost surface of the dielectric layer 22 in the third direction D3. As shown in FIG. 5 and FIG. 6, the second mask M2 is removed after the second pull-down process 92, and the topmost surface of the barrier layer 31 in the first trench TR1 is lower than the topmost surface of the dielectric layer 22 in the third direction D3.

When an identical pull-down process is performed to the barrier layer 31 above the first region R1 and the second region R2 concurrently, the height of the barrier layer 31 in the first trench TR1 will be obviously lower than the height of the barrier layer 31 in the second trench TR2 after the pull-down process because of etching loading effect generated by the difference between the density of the dielectric layer 32 above the first region R1 and the density of the dielectric layer 32 above the second region R2. The height difference between a recessed barrier layer 31R in the first trench TR1 and a recessed barrier layer 31R in the second trench TR2 may result in a structure difference between a gate structure subsequently formed in the first trench TR1 and a gate structure subsequently formed in the second trench TR2, and the resistance of the gate structure in the first trench TR1 will be different from the resistance of the gate structure in the second trench TR2 seriously even if the dimension of the first trench TR1 is substantially equal to the dimension of the second trench TR2. However, as shown in FIGS. 3-6, by performing different pull-down processes (i.e. the second pull-down process 92 and the first pull-down process 91) to the barrier layer 31 above the first region R1 and the barrier layer 31 above the second region R2 respectively, the height of the barrier layer 31 in the second trench TR2 after the first pull-down process 91 may be substantially equal to the height of the barrier layer 31 in the second trench TR2 after the second pull-down process 92, or at least the height difference between the recessed barrier layer 31R in the first trench TR1 and the recessed barrier layer 31R in the second trench TR2 may be reduced, and the problems described above may be improved accordingly. In some embodiments, the etching time of the second pull-down process 92 may be shorter than the etching time of the first pull-down process 91, and/or the etching rate of the barrier layer 31 in the second pull-down process 92 may be lower than the etching rate of the barrier layer 31 in the first pull-down process 91, but not limited thereto. In some embodiments, the first pull-down process 91 may be performed before the second pull-down process 92. In some embodiments, the second pull-down process 92 may be performed before the first pull-down process 91.

Figure 7:
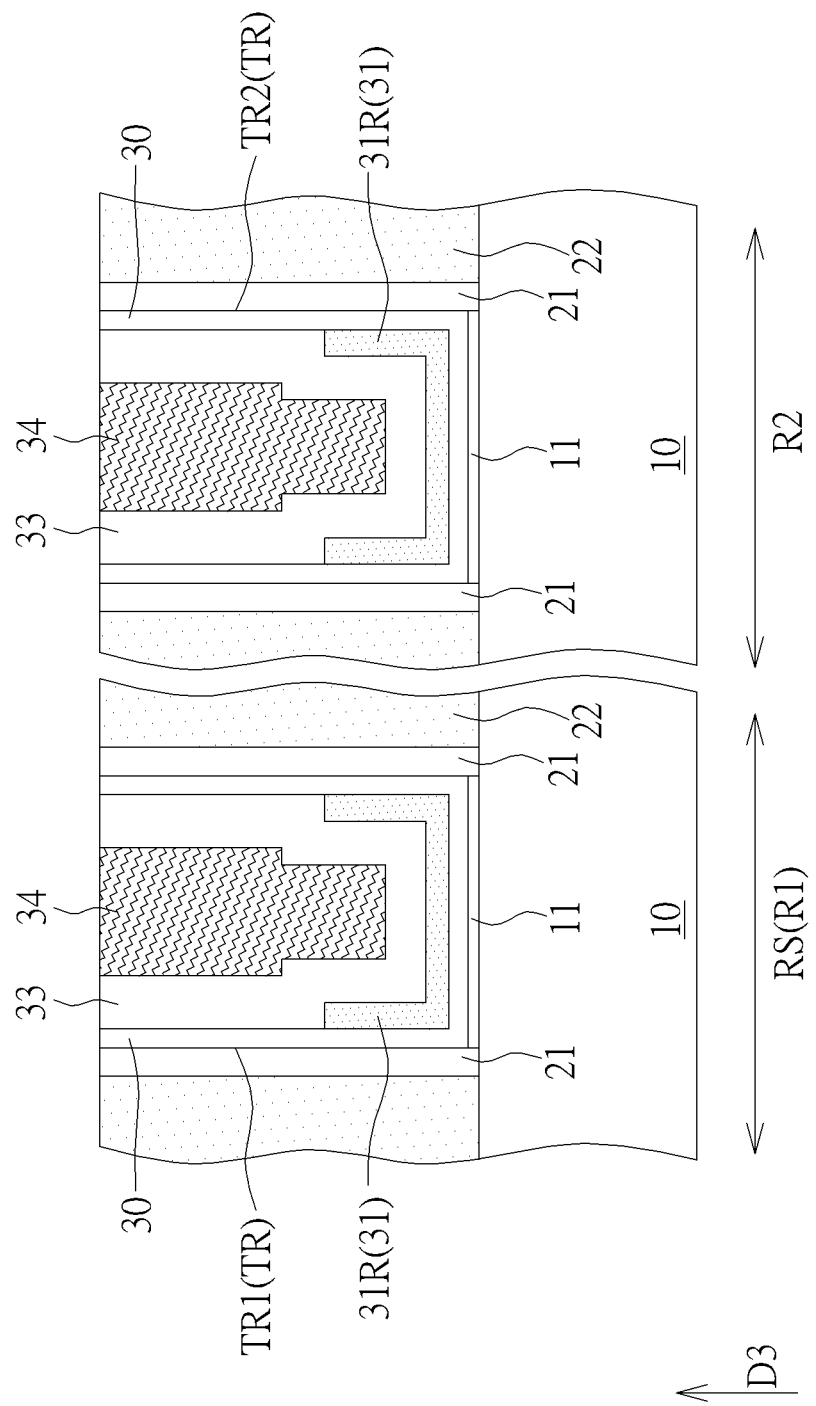
Figure 8:
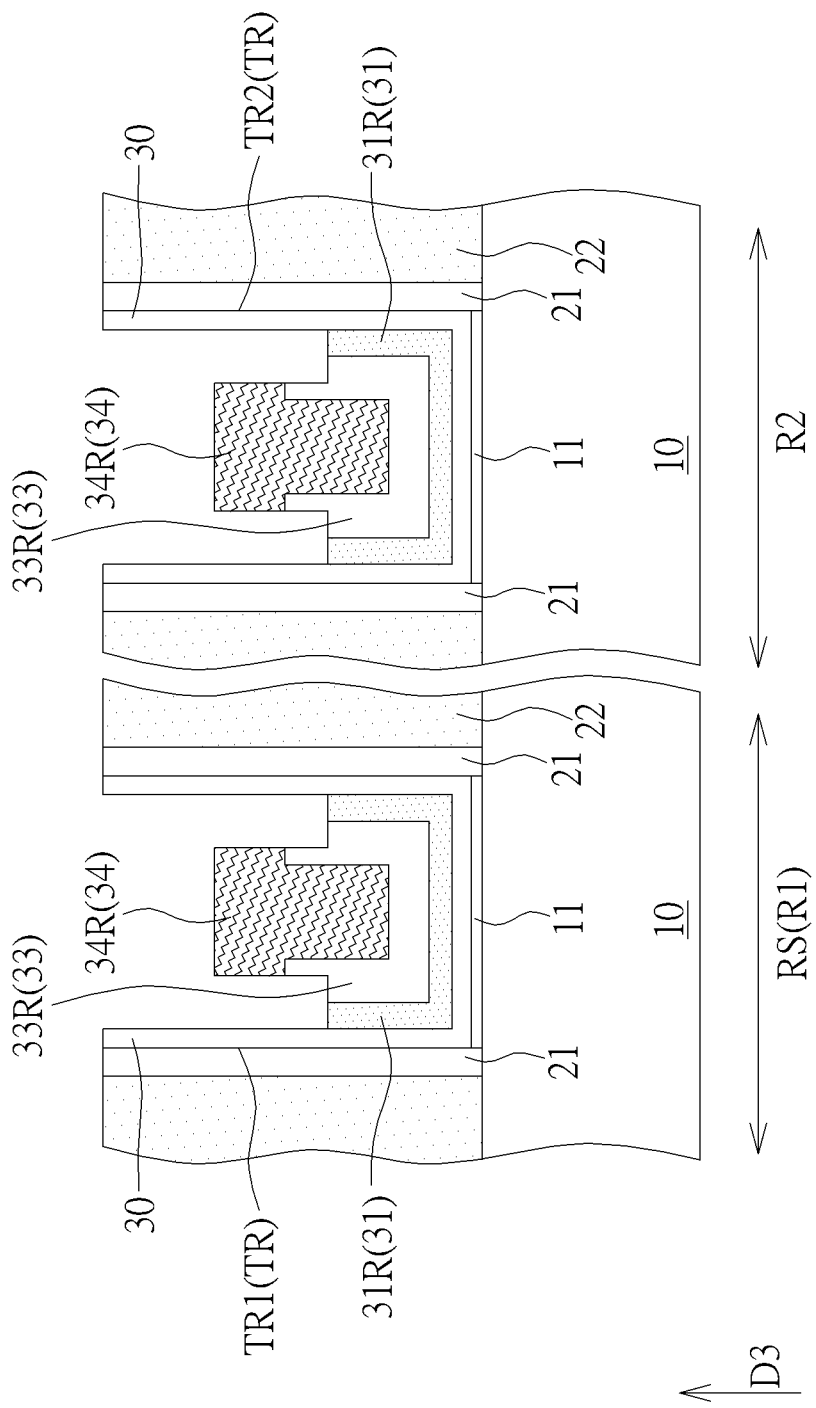

As shown in FIG. 3, in some embodiments, a gate dielectric layer 30 may be formed conformally in the trenches TR before the step of forming the barrier layer 31. The gate dielectric layer 30 may include high dielectric constant (high-k) materials, such as hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), and zirconium oxide ($ZrO_2$), or other suitable dielectric materials. As shown in FIGS. 3-7, after the first pull-down process 91 and the second pull-down process 92, the dielectric layer 32 may be removed, a work function layer 33 may be formed in the trenches TR, and a metal gate 34 may be formed in each trench TR and formed on the work function layer 33 in each trench TR. The metal gate 34 may include a low resistivity metal material, such as aluminum (Al), tungsten (W), copper (Cu), titanium aluminide (TiAl), or other suitable low resistivity metal materials. The wok function layer 33 may include tantalum nitride, titanium nitride, titanium carbide (TiC), titanium aluminide (TiAl), titanium aluminum carbide (TiAlC), or other suitable N type work function materials and/or P type work function materials. As shown in FIG. 7 and FIG. 8, an etching back process may be performed to the metal gate 34 and the work function layer 33 in the trenches TR above the first region R1 and the second region R2 for forming a gate structure including a recessed metal gate 34R, a recessed work function layer 33R, and the recessed barrier layer 31R in each trench TR.

When the barrier layer 31 above the first region R1 and the barrier layer 31 above the second region R2 are etched back by the same pull-down process, the dimension of the recessed metal gate 34R in the second trench TR2 will be smaller than the dimension of the recessed metal gate 34R in the first trench TR1 even if the dimension of the first trench TR1 is substantially equal to the dimension of the second trench TR2 because the height of the recessed barrier layer 31R in the second trench TR2 will be higher than the height of the recessed barrier layer 31R in the first trench TR1 due to the difference in trench density between the first region R1 and the second region R2. Therefore, by the manufacturing method of the semiconductor device in the present invention, the height variation range of the barrier layer 31 in the trenches TR above regions having different trench densities may be reduced, and the electrical properties and/or the manufacturing yield of the semiconductor device may be improved accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 9:
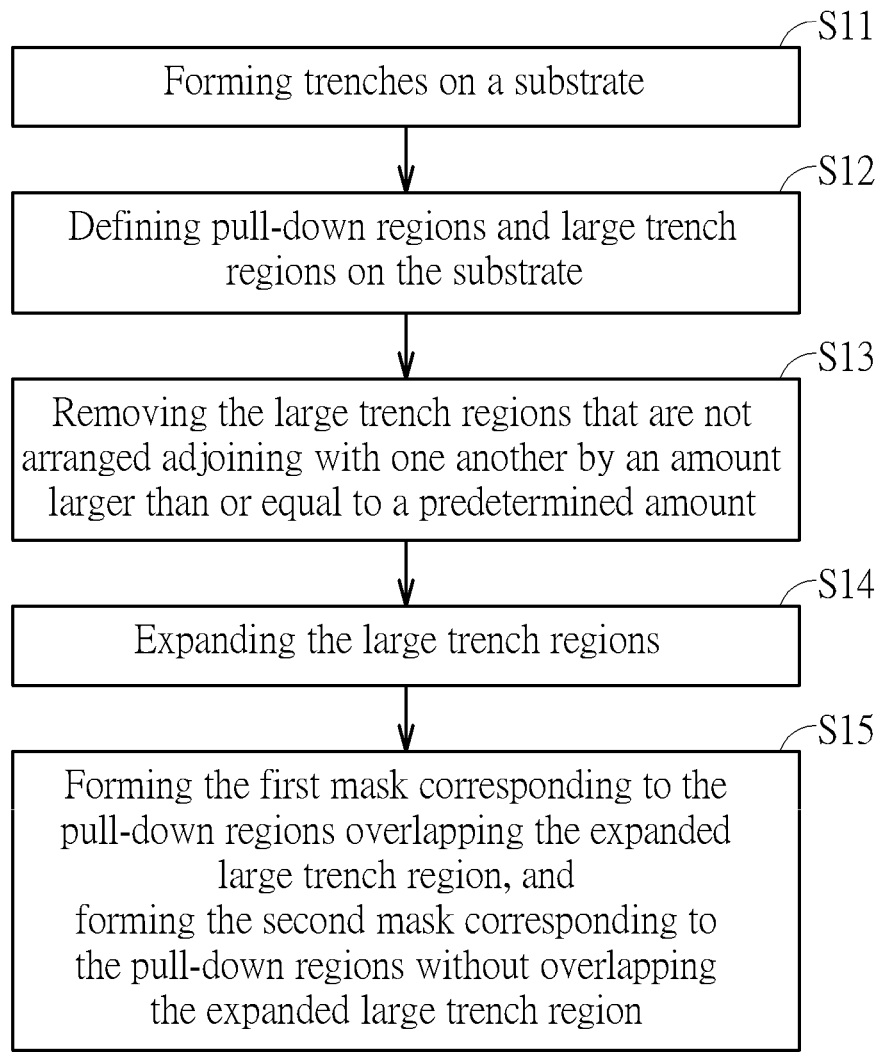
FIG. 9 is a flow chart of a method for forming a first mask and a second mask in the manufacturing method of the semiconductor device according to a first embodiment of the present invention.
Figure 10:
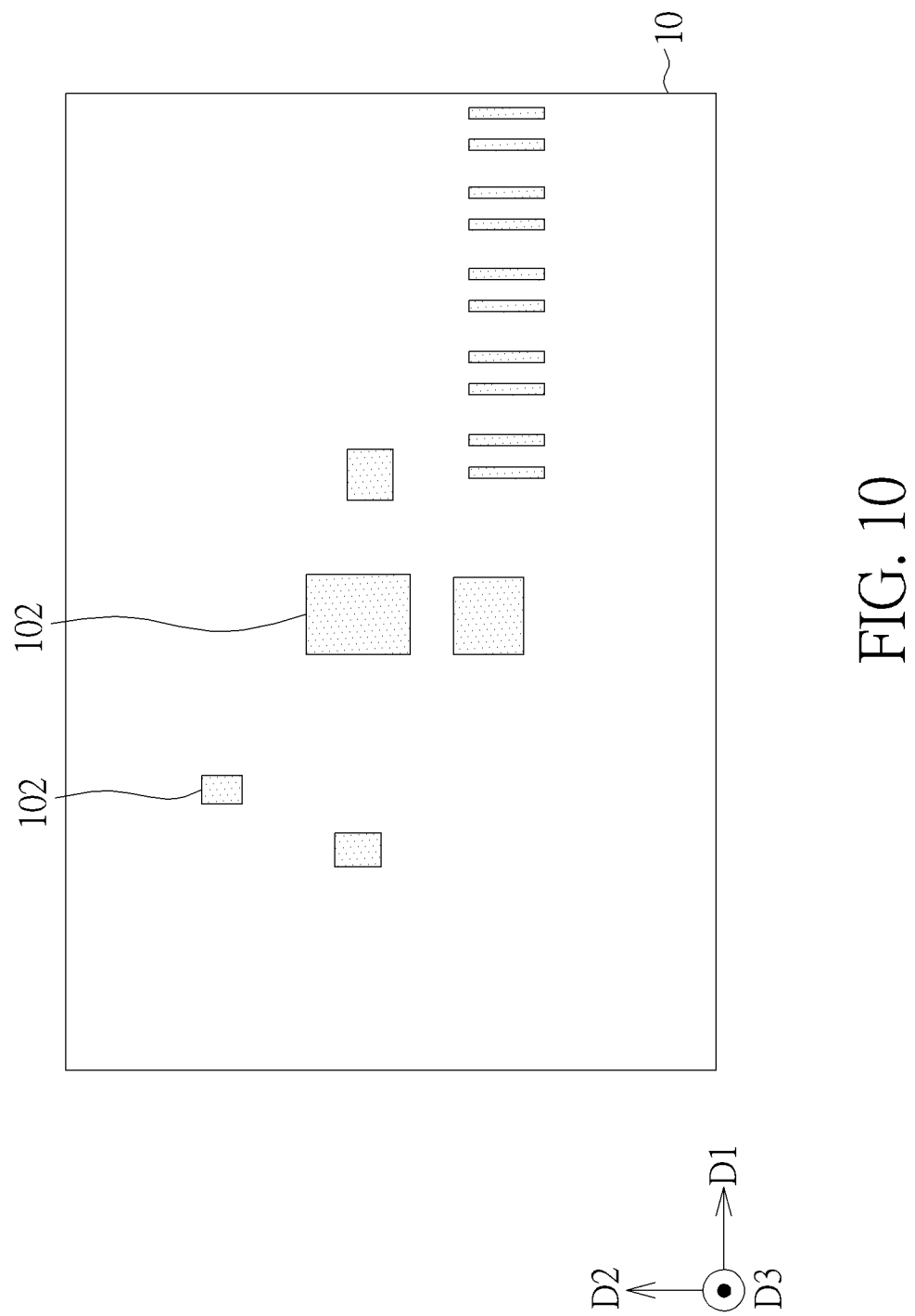

Please refer to FIGS. 9-13 and FIGS. 2-6. FIG. 9 is a flowchart of a method for forming the first mask and the second mask in the manufacturing method of the semiconductor device according to a first embodiment of the present invention. FIGS. 10-13 are schematic drawings illustrating the method for forming the first mask and the second mask in this embodiment. In this embodiment, the method for forming the first mask (such as the first mask M1 shown in FIG. 3) and the second mask (such as the second mask M2 shown in FIG. 5) may include the following steps. As shown in FIG. 9 and FIG. 2, in step S11, the trenches TR are formed on the substrate 10. For the simplicity of the figures, the trenches TR depicted in FIG. 2 are not shown in FIGS. 10-13. As shown in FIGS. 9-11 and FIG. 2, in step S12, a plurality of pull-down regions 102 and a plurality of large trench regions 104 may be defined on the substrate 10. Some of the trenches TR are formed on the pull-down regions 102, and some of the trenches TR are formed on the large trench regions 104. The trenches TR on the pull-down regions 102 have to be treated by a pull-down process. For example, the pull-down regions 102 may include the second region R2, the sub region RS, and/or the first region R1 described above. The trenches TR on the large trench region 104 have respectively larger dimensions, such as a trench with a dimension similar to that of the third trench TR3 described above. Therefore, a width of the trench TR on the large trench region 104 may be larger than a width of the trench TR on the pull-down region 102. For example, the width of the trench TR on the large trench region 104 may be larger than or equal to 150 nanometers, and the width of the trench TR on the pull-down region 102 may be smaller than or equal to 24 nanometers, but not limited thereto. In some embodiments, the pull-down regions 102 and the large trench regions 104 may be defined after forming the trenches TR. In some embodiments, the pull-down regions 102 and the large trench regions 104 may be defined before forming the trenches TR, and the pull-down regions 102 and the large trench regions 104 may be defined according to the layout specification of the dummy gates described above.

Figure 11:
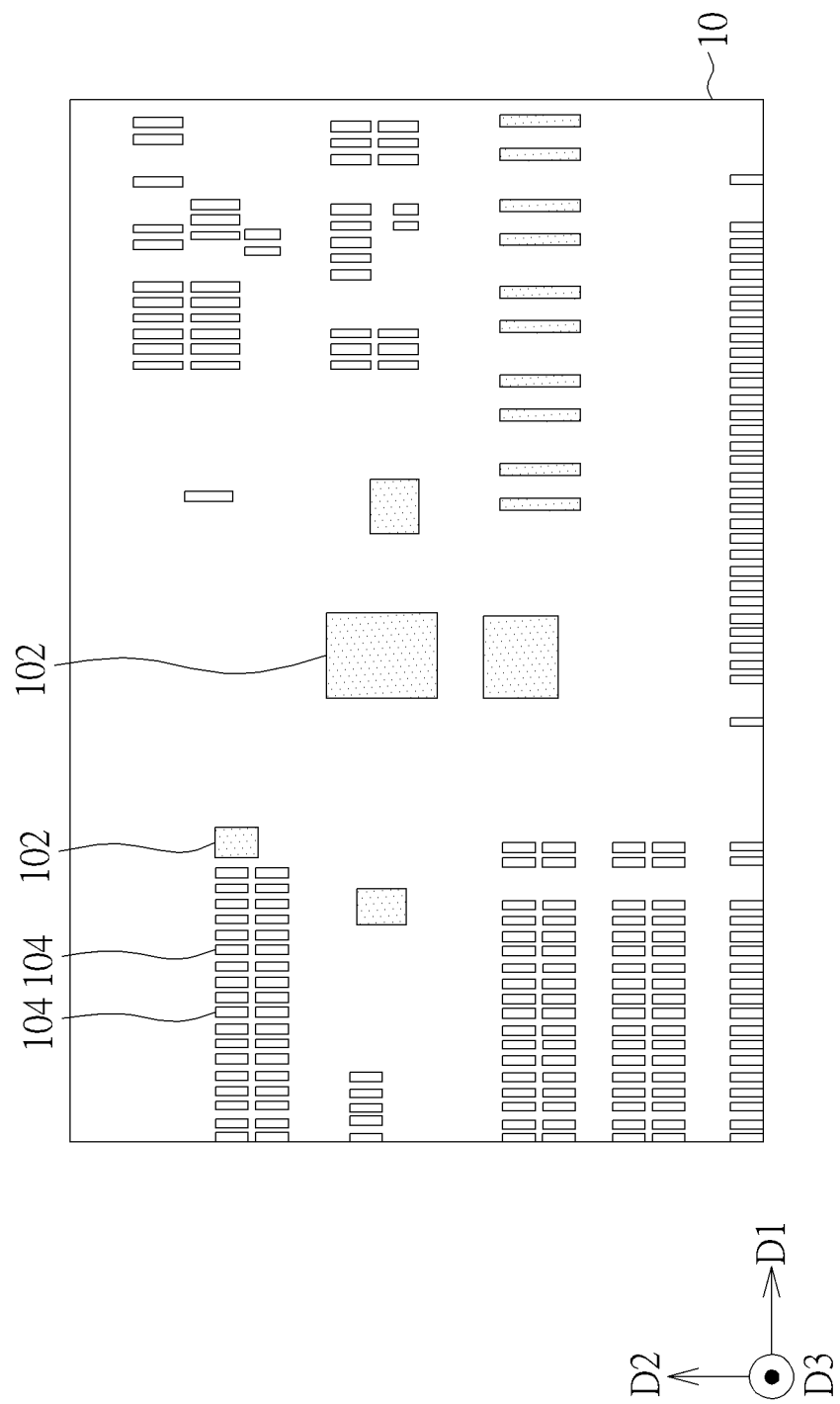
Figure 13:
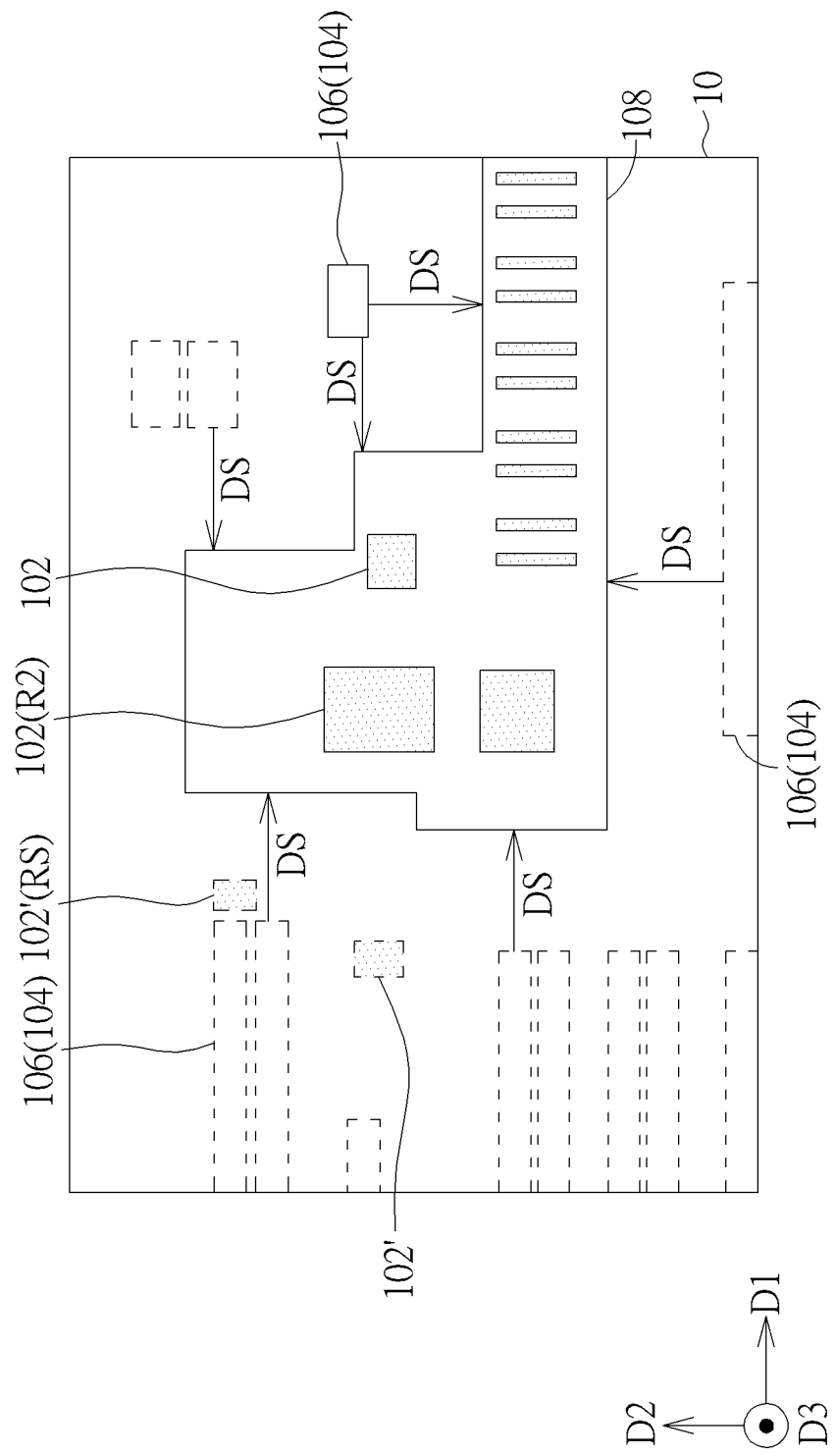

As shown in FIG. 9, FIG. 11, and FIG. 13, in step S14, the large trench regions 104 are expanded by a predetermined distance DS to form an expanded large trench region 108, and the expanded large trench region 108 may overlap some of the pull-down regions (such as the pull-down regions 102' shown in FIG. 13). In some embodiments, the predetermined distance DS may be equal to or larger than 4 micrometers, but not limited thereto. Each of the large trench regions 104 may be expanded by the predetermined distance DS in a first direction D1 and a second direction D2 perpendicular to the first direction D1. The pull-down regions 102' are regarded as the pull-down regions influenced by the large trench regions 104 seriously. For example, at least one of the pull-down regions 102' may include the sub region RS within the first region R1 and/or the first region R1 shown in FIG. 2, and at least one of the pull-down regions 102 without overlapping the expanded large trench region 108 may include the second region R2 shown in FIG. 2. Therefore, as shown in FIG. 9, FIG. 13, FIG. 3, and FIG. 5, in step S15, the first mask M1 shown in FIG. 3 may be formed corresponding to the pull-down regions 102' overlapping the expanded large trench region 108, and the second mask M2 shown in FIG. 5 may be formed corresponding to the pull-down regions 102 without overlapping the expanded large trench region 108.

Figure 12:
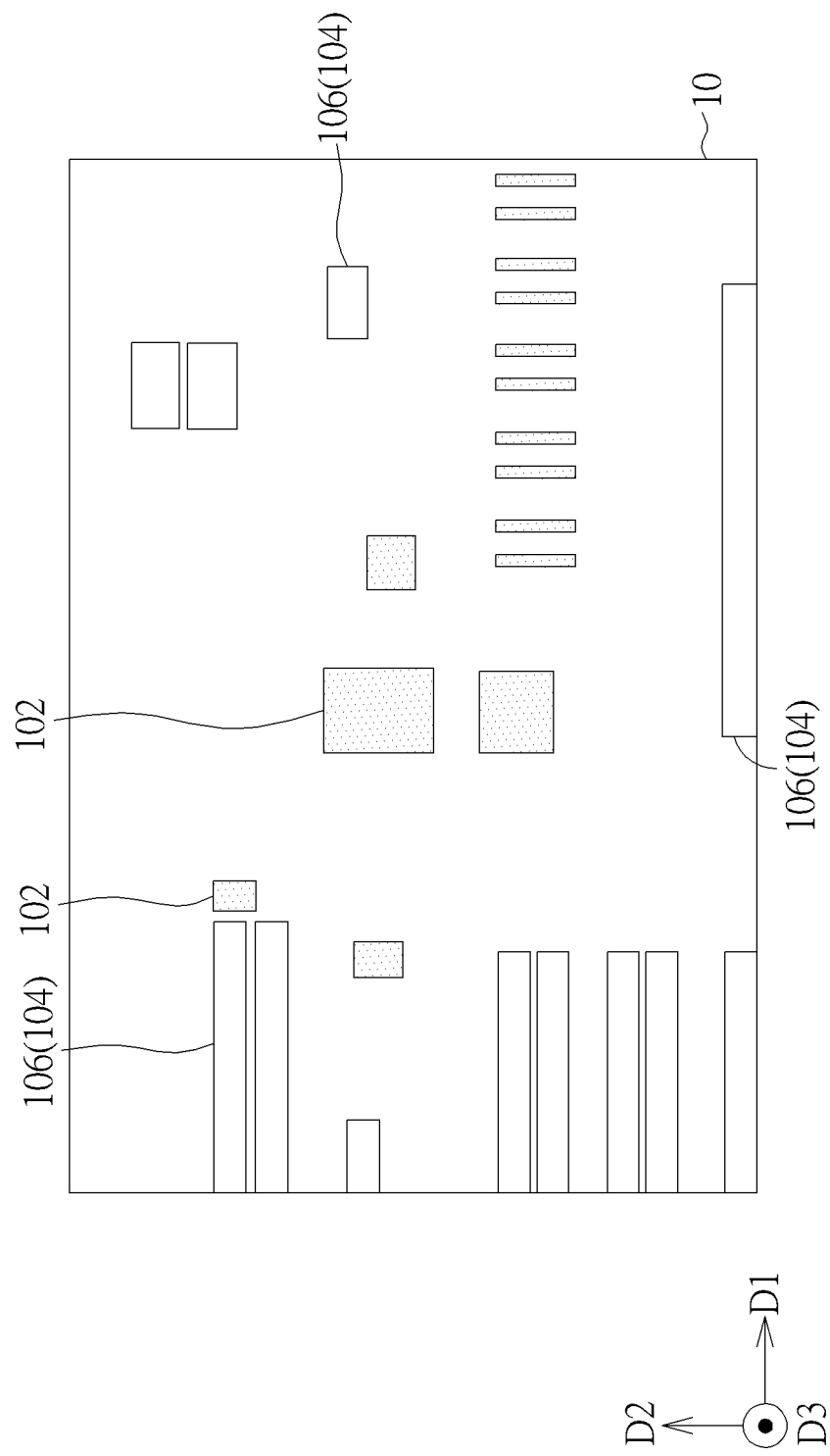

In some embodiments, each of the large trench regions 104 may include only one of the trenches TR with a respectively larger dimension. As shown in FIG. 9, FIG. 11, and FIG. 12, in step S13, when some of the large trench regions 104 are not arranged adjoining with one another by an amount larger than or equal to a predetermined amount in the first direction D1, the method may further include removing the large trench regions 104 that are not arranged adjoining with one another by an amount larger than or equal to the predetermined amount in the first direction D1 before expanding the large trench regions 104. In addition, the large trench regions 104 that are arranged adjoining with one another by an amount larger than or equal to the predetermined amount in the first direction D1 may be merged to be a merged large trench region 106 before the step of expanding the large trench regions 104, and each of the merged large trench region 106 may be expanded by the predetermined distance DS in the first direction D1 and the second direction D2, but not limited thereto. In some embodiments, the predetermined amount described above may be 5 or larger than 5.

By the manufacturing method in this embodiment, the pull-down regions may be divided into two separated groups for being treated by different pull-down processes, and the variation range of the recessed depth of the barrier layer may be reduced accordingly. For example, when the proportion of the area of the trenches on each pull-down region to the area of the pull-down region (i.e. the trench density) ranges from 6% to 60%, and all of the pull-down regions are treated by the same pull-down process, the variation range of the recessed depth of the barrier layer may be about 400 angstroms. By the manufacturing method in this embodiment, the variation range of the recessed depth of the barrier layer may be reduced to be about 245 angstroms when the pull-down regions are divided into two separated groups and treated by two different pull-down processes respectively. The process window of the pull-down processes may be improved accordingly. In some embodiments, when the trench densities of pull-down regions range from 12% to 45%, the first mask described above may cover the regions having the trench density ranging from 27% to 45%, and the second mask described above may cover the regions having the trench density ranging from 12% to 30%, but not limited thereto.

Figure 14:
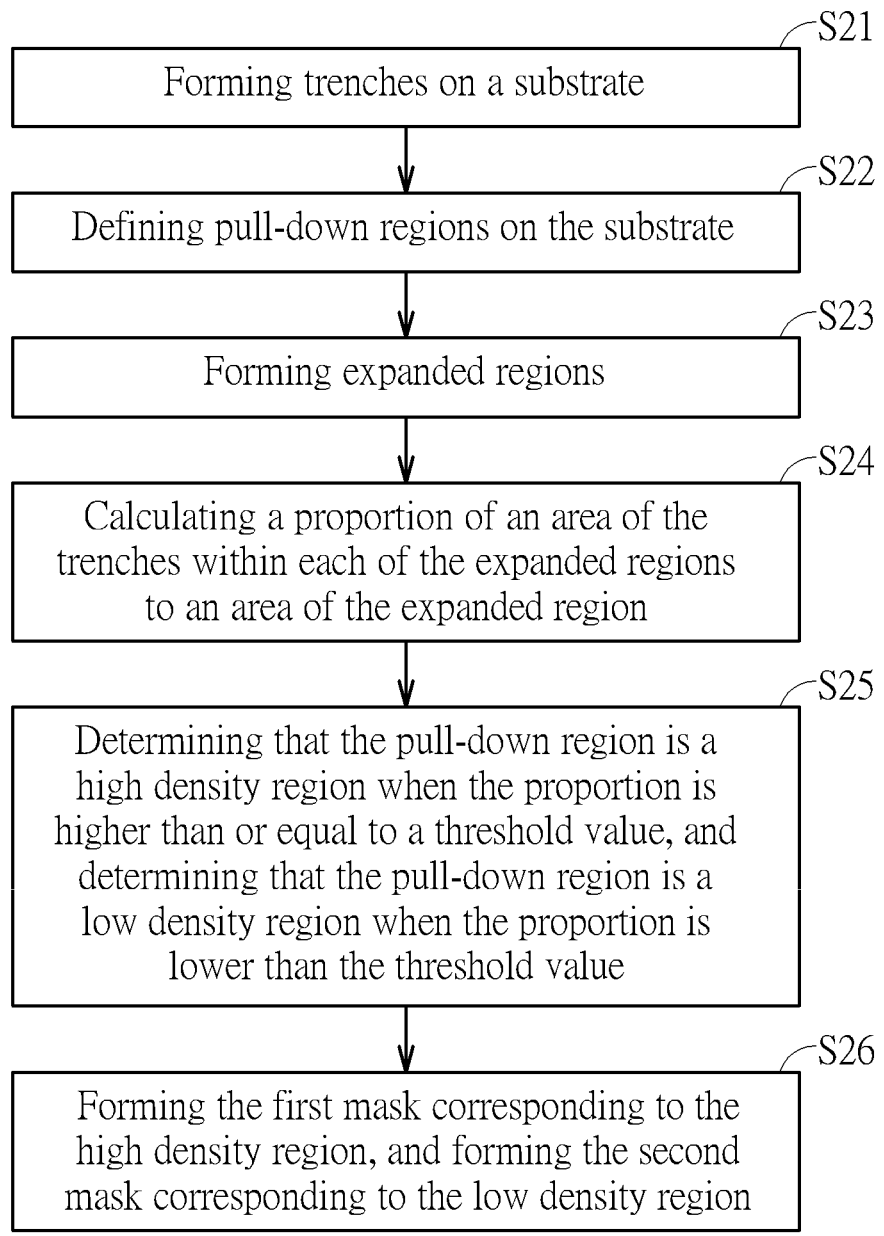
FIG. 14 is a flow chart of the method for forming the first mask and the second mask in the manufacturing method of the semiconductor device according to a second embodiment of the present invention.
Figure 15:
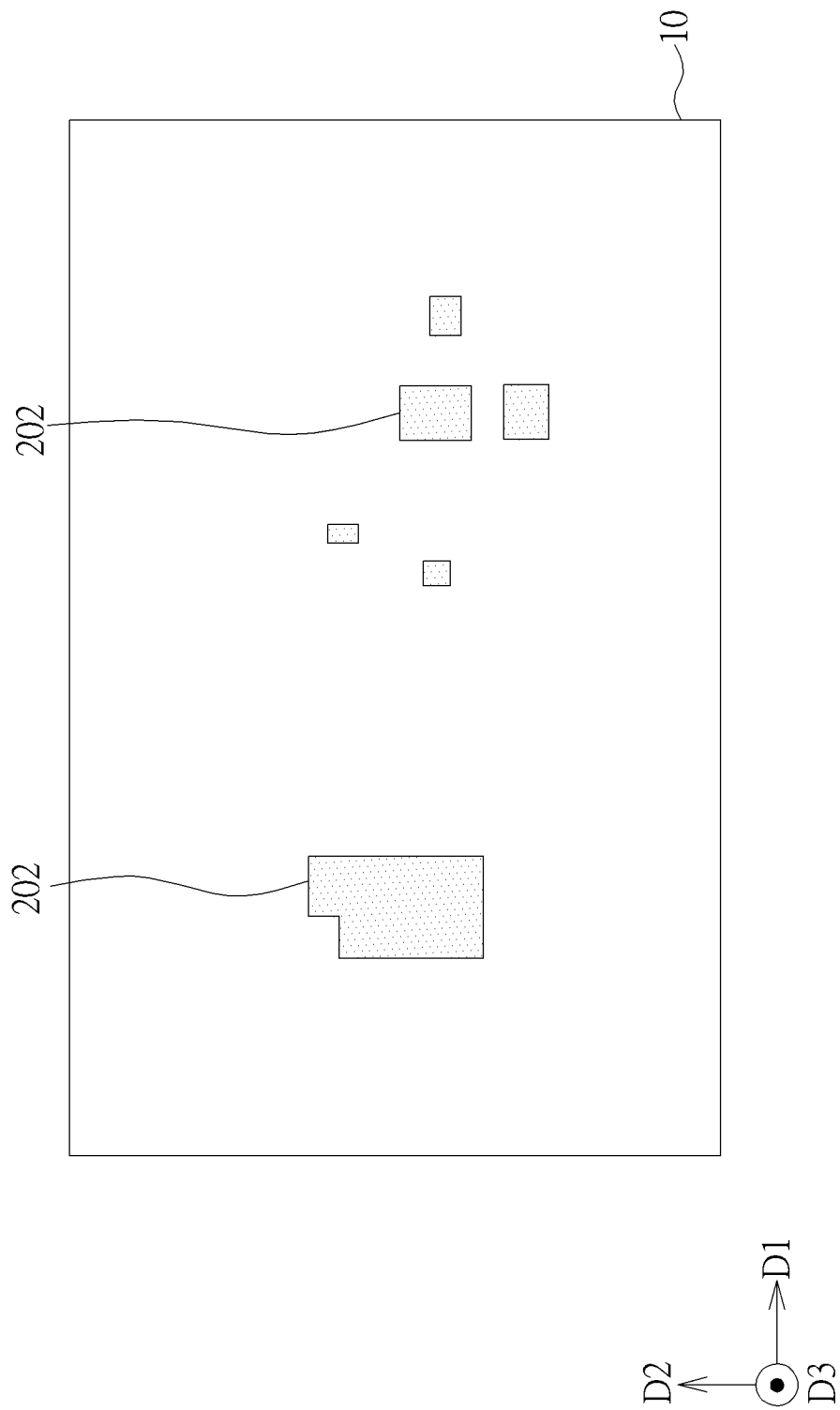
Figure 16:
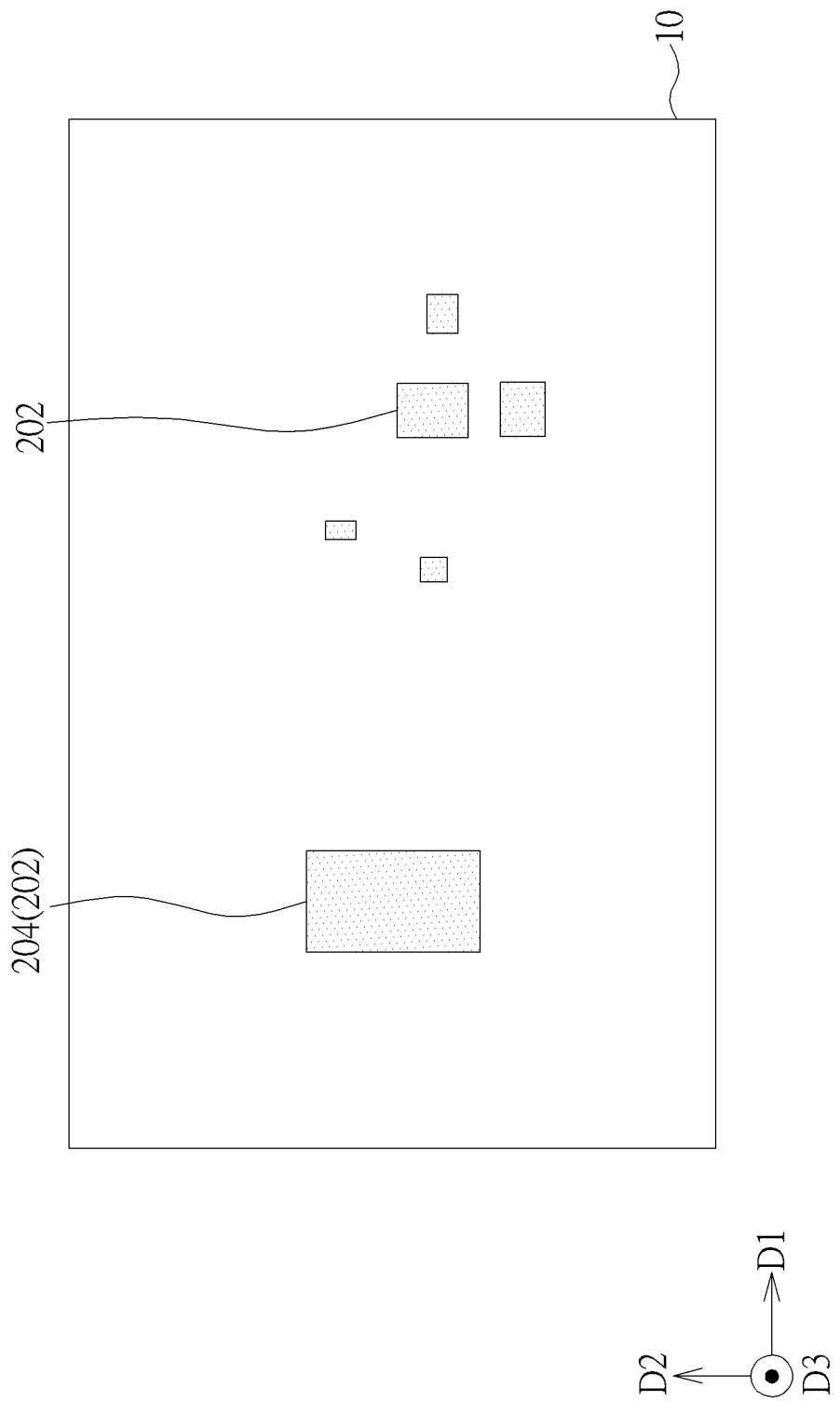

Please refer to FIGS. 14-18 and FIGS. 2-6. FIG. 14 is a flow chart of the method for forming the first mask and the second mask in the manufacturing method of the semiconductor device according to a second embodiment of the present invention. FIGS. 15-18 are schematic drawings illustrating the method for forming the first mask and the second mask in this embodiment. In this embodiment, the method for forming the first mask (such as the first mask M1 shown in FIG. 3) and the second mask (such as the second mask M2 shown in FIG. 5) may include the following steps. As shown in FIG. 14 and FIG. 2, in step S21, the trenches TR are formed on the substrate 10. For the simplicity of the figures, the trenches TR depicted in FIG. 2 are not shown in FIGS. 15-18. As shown in FIG. 14, FIG. 15, and FIG. 2, in step S22, a plurality of pull-down regions 202 are defined on the substrate 10. Some of the trenches TR are formed on the pull-down regions 202, and some of the trenches TR are formed outside the pull-down regions 202. The trenches TR on the pull-down regions 202 have to be treated by a pull-down process. For example, the pull-down regions 202 may include the second region R2, the sub region RS, and/or the first region R1 described above. In some embodiments, the pull-down regions 202 may be defined after forming the trenches TR. In some embodiments, the pull-down regions 202 may be defined before forming the trenches TR, and the pull-down regions 202 may be defined according to the layout specification of the dummy gates described above.

Figure 17:
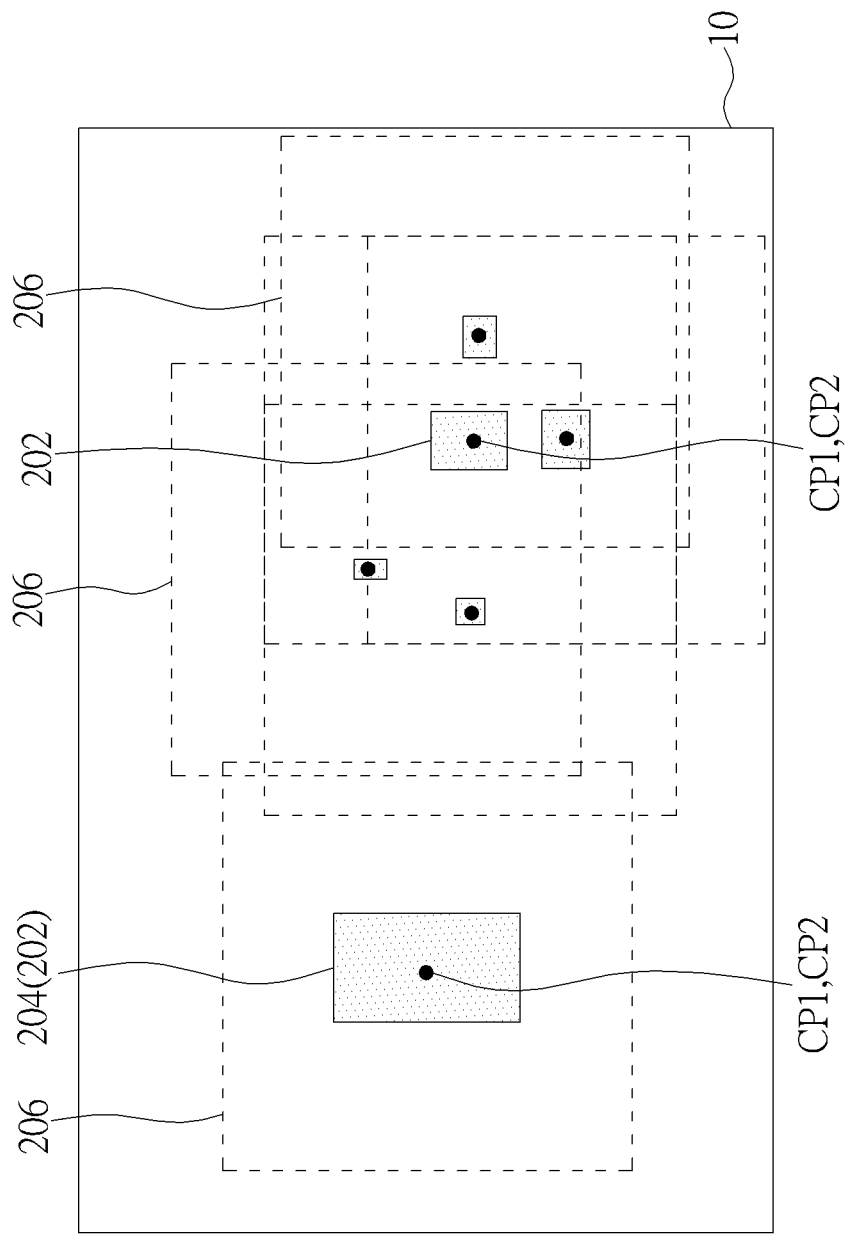
Figure 18:
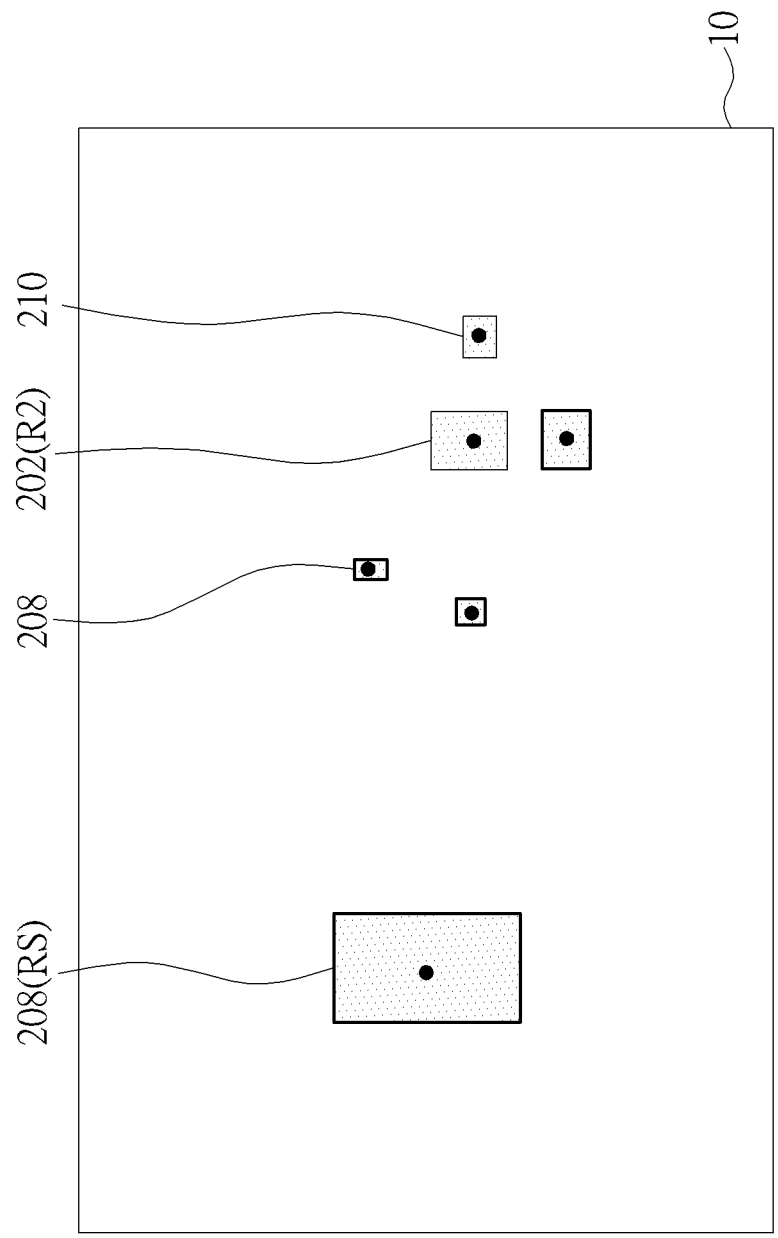
Figure 18:
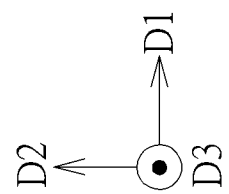

As shown in FIG. 13, FIG. 17, and FIG. 2, in step S23, a plurality of expanded regions 206 may be formed. Each of the expanded regions 206 may be formed overlapping one of the pull-down regions 202, and each of the expanded regions 206 is larger than the pull-down region overlapped by the expanded region. In some embodiments, a center point (such as a first center point CP1 shown in FIG. 17) of each of the pull-down regions 202 may overlap a center point (such as a second center point CP2 shown in FIG. 17) of the corresponding expanded region 206 in the third direction D3, the areas of the expanded regions 206 may be equal to one another, and a shape of each of the expanded regions 206 may be a square, but not limited thereto. For example, the shape of each of the expanded regions 206 may be a square having a side length of 15 nanometers or other suitable values.

As shown in FIG. 13, FIG. 17, FIG. 18, and FIG. 2, in step S24, a proportion of an area of the trenches TR within each of the expanded regions 206 to an area of the expanded region 206 is calculated. In step S25, one of the pull-down regions 202 is determined to be a high density region 208 when a proportion of an area of the trenches TR within the expanded region 206 overlapping the pull-down region 202 to an area of the expanded region 206 is higher than or equal to a threshold value, and one of the pull-down regions 202 is determined to be a low density region 210 when a proportion of an area of the trenches TR within the expanded region 206 overlapping the pull-down region 202 to an area of the expanded region 206 is lower than the threshold value. In other words, when the trench density within the expanded region 206 is higher than or equal to the threshold value, the pull-down region 202 corresponding to this expanded region 206 is regarded as a high density region 208, and when the trench density within the expanded region 206 is lower than the threshold value, the pull-down region 202 corresponding to this expanded region 206 is regarded as a low density region 210. The high density regions 208 may be regarded as the pull-down regions influenced by the large trench regions seriously. For example, at least one of the high density regions 208 may include the sub region RS within the first region R1 and/or the first region R1 shown in FIG. 2, and at least one of the low density regions 210 may include the second region R2 shown in FIG. 2. Therefore, as shown in FIG. 14, FIG. 18, FIG. 3, and FIG. 5, in step S26, the first mask M1 shown in FIG. 3 may be formed corresponding to the high density regions 208, and the second mask M2 shown in FIG. 5 may be formed corresponding to the low density regions 210.

In some embodiments, the shapes of some of the pull-down region 202 may not be rectangular. As shown in FIGS. 14-17, in step S23, the method may further include expanding the pull-down region 202 to be a rectangular region 204 before forming the expanded regions 206 when a shape of the pull-down region 202 is not a rectangle. At least one edge of the rectangular region 204 overlaps an edge of the corresponding pull-down region 202. One of the expanded regions 206 may be formed overlapping the rectangular region 204, and a center point (such as the first center point CP1) of the rectangular region 204 may overlap the second center point CP2 of the corresponding expanded region 206 in the third direction D3.

To summarize the above descriptions, in the manufacturing method of the semiconductor device according to the present invention, different pull-down processes are performed to the barrier layer in the trenches on the regions with different trench densities respectively for reducing the height variation range of the barrier layer in different trenches. The related electrical properties of the semiconductor device and the related process window may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
    forming a plurality of trenches on a substrate, wherein a first region and a second region are defined on the substrate, and the trenches are formed on the first region and the second region, wherein the trenches on the first region comprise a first trench, the trenches on the second region comprise a second trench, and a width of the first trench is equal to a width of the second trench;
    forming a barrier layer conformally in the trenches;
    performing a first pull-down process to the barrier layer in the trenches formed on the second region, wherein the barrier layer in the trenches formed on the first region is covered by a first mask during the first pull-down process; and
    performing a second pull-down process to the barrier layer in the trenches formed on the first region, wherein the barrier layer in the trenches formed on the second region is covered by a second mask during the second pull-down process, and a proportion of an area of the trenches on the first region to an area of the first region is different from a proportion of an area of the trenches on the second region to an area of the second region.

2. The manufacturing method of the semiconductor device according to claim 1, wherein a height of the barrier layer in the second trench after the first pull-down process is equal to a height of the barrier layer in the first trench after the second pull-down process.

3. The manufacturing method of the semiconductor device according to claim 1, wherein the trenches on the first region further comprise a third trench, and a width of the third trench is larger than the width of the first trench.

4. The manufacturing method of the semiconductor device according to claim 3, wherein the first trench is formed on a sub region within the first region, and the third trench is formed outside the sub region.

5. The manufacturing method of the semiconductor device according to claim 4, wherein a method for forming the first mask and the second mask comprises:
    defining a plurality of pull-down regions and a plurality of large trench regions on the substrate, wherein a width of the trench on the large trench region is larger than a width of the trench on the pull-down region;
    expanding the large trench regions by a predetermined distance to form an expanded large trench region, wherein the expanded large trench region overlap some of the pull-down regions;
    forming the first mask corresponding to the pull-down regions overlapping the expanded large trench region; and
    forming the second mask corresponding to the pull-down regions without overlapping the expanded large trench region.

6. The manufacturing method of the semiconductor device according to claim 5, wherein the predetermined distance is equal to or larger than 4 micrometers.

7. The manufacturing method of the semiconductor device according to claim 5, wherein some of the large trench regions are not arranged adjoining with one another by an amount larger than or equal to a predetermined amount in a first direction, and the method for forming the first mask and the second mask further comprises:
    removing the large trench regions that are not arranged adjoining with one another by an amount larger than or equal to the predetermined amount in the first direction before expanding the large trench regions.

8. The manufacturing method of the semiconductor device according to claim 7, wherein the predetermined amount is 5.

9. The manufacturing method of the semiconductor device according to claim 5, wherein at least one of the pull-down regions overlapping the expanded large trench region includes the sub region within the first region, and at least one of the pull-down regions without overlapping the expanded large trench region includes the second region.

10. The manufacturing method of the semiconductor device according to claim 5, wherein the pull-down regions and the large trench regions are defined after forming the trenches.

11. The manufacturing method of the semiconductor device according to claim 5, wherein each of the large trench regions is expanded by the predetermined distance in a first direction and a second direction perpendicular to the first direction.

12. The manufacturing method of the semiconductor device according to claim 4, wherein a method for forming the first mask and the second mask comprises:
defining a plurality of pull-down regions on the substrate;
forming a plurality of expanded regions, wherein each of the expanded regions is formed overlapping one of the pull-down regions, and each of the expanded regions is larger than the pull-down region overlapped by the expanded region;
calculating a proportion of an area of the trenches within each of the expanded regions to an area of the expanded region;
determining that one of the pull-down regions is a high density region when a proportion of an area of the trenches within the expanded region overlapping the pull-down region to an area of the expanded region is higher than or equal to a threshold value;
determining that one of the pull-down regions is a low density region when a proportion of an area of the trenches within the expanded region overlapping the pull-down region to an area of the expanded region is lower than the threshold value;
forming the first mask corresponding to the high density region; and
forming the second mask corresponding to the low density region.

13. The manufacturing method of the semiconductor device according to claim 12, wherein the method for forming the first mask and the second mask further comprises:
expanding the pull-down region to be a rectangular region before forming the expanded regions when a shape of the pull-down region is not a rectangle.

14. The manufacturing method of the semiconductor device according to claim 13, wherein at least one edge of the rectangular region overlaps an edge of the corresponding pull-down region.

15. The manufacturing method of the semiconductor device according to claim 12, wherein a center point of each of the pull-down regions overlaps a center point of the corresponding expanded region.

16. The manufacturing method of the semiconductor device according to claim 12, wherein a shape of each of the expanded regions is a square.

17. The manufacturing method of the semiconductor device according to claim 12, wherein the areas of the expanded regions are equal to one another.

18. The manufacturing method of the semiconductor device according to claim 12, wherein the high density region includes the sub region within the first region, and the low density region includes the second region.

19. The manufacturing method of the semiconductor device according to claim 1, further comprising:
forming a work function layer in the trenches after the first pull-down process and the second pull-down process; and
forming a metal gate in the trenches and on the work function layer in the trenches.

* * * * *